(12) United States Patent
Meyer et al.

(10) Patent No.: US 9,984,900 B2
(45) Date of Patent: May 29, 2018

(54) SEMICONDUCTOR DEVICE INCLUDING AT LEAST ONE ELEMENT

(71) Applicant: Infineon Technologies AG, Neubiberg (DE)

(72) Inventors: Thorsten Meyer, Regensburg (DE); Jens Pohl, Bernhardswald (DE)

(73) Assignee: Infineon Technologies AG, Neubiberg (DE)

(\*) Notice: Subject to any disclaimer, the term of this patent is extended or adjusted under 35 U.S.C. 154(b) by 0 days. days.

(21) Appl. No.: 15/226,260

(22) Filed: Aug. 2, 2016

(65) Prior Publication Data

US 2016/0343616 A1 Nov. 24, 2016

Related U.S. Application Data

(63) Continuation of application No. 14/189,304, filed on Feb. 25, 2014, now abandoned, which is a (Continued)

(51) Int. Cl.
*H01L 21/56* (2006.01)
*H01L 23/31* (2006.01)
(Continued)

(52) U.S. Cl.
CPC ............ *H01L 21/56* (2013.01); *H01L 21/561* (2013.01); *H01L 21/563* (2013.01); *H01L 21/568* (2013.01); *H01L 21/6836* (2013.01); *H01L 21/78* (2013.01); *H01L 23/31* (2013.01); *H01L 23/3107* (2013.01); *H01L 23/3121* (2013.01); *H01L 23/3128* (2013.01); *H01L 23/3135* (2013.01); *H01L 23/3192* (2013.01);

*H01L 23/488* (2013.01); *H01L 23/49861* (2013.01); *H01L 24/11* (2013.01); *H01L 24/14* (2013.01); *H01L 24/19* (2013.01); *H01L 24/96* (2013.01); *H01L 24/97* (2013.01); *H01L 23/28* (2013.01); *H01L 23/50* (2013.01); *H01L 23/5389* (2013.01); *H01L 2221/68327* (2013.01); *H01L 2224/05001* (2013.01); *H01L 2224/05026* (2013.01); *H01L 2224/05548* (2013.01); *H01L 2224/12105* (2013.01);
(Continued)

(58) Field of Classification Search
CPC ... H01L 23/3128; H01L 24/82; H01L 25/042; H01L 23/28; H01L 23/31; H01L 23/3107; H01L 23/3121; H01L 23/3135; H01L 23/3192; H01L 21/56; H01L 21/561; H01L 21/563; H01L 21/568
See application file for complete search history.

(56) References Cited

U.S. PATENT DOCUMENTS 4,999,484 A \* 3/1991 Kaneko ............... H01L 25/042
250/208.1
5,353,498 A 10/1994 Fillion
(Continued)

FOREIGN PATENT DOCUMENTS

EP 0611129 8/1994

*Primary Examiner* — Eduardo A Rodela
(74) *Attorney, Agent, or Firm* — Dicke, Billig & Czaja, PLLC

(57) ABSTRACT

A semiconductor device includes a chip, at least one element electrically coupled to the chip, an adhesive at least partially covering the at least one element, and a mold material at least partially covering the chip and the adhesive.

28 Claims, 4 Drawing Sheets

Related U.S. Application Data continuation of application No. 12/048,602, filed on Mar. 14, 2008, now Pat. No. 8,659,154.

(51) Int. Cl.

| | | |
|---|---|---|
| *H01L 23/488* | (2006.01) | |
| *H01L 23/00* | (2006.01) | |
| *H01L 23/498* | (2006.01) | |
| *H01L 21/683* | (2006.01) | |
| *H01L 21/78* | (2006.01) | |
| *H01L 23/28* | (2006.01) | |
| *H01L 23/50* | (2006.01) | |
| *H01L 23/538* | (2006.01) | |

(52) U.S. Cl.
CPC ...... *H01L 2224/24195* (2013.01); *H01L 2224/97* (2013.01); *H01L 2924/00014* (2013.01); *H01L 2924/01005* (2013.01); *H01L 2924/01029* (2013.01); *H01L 2924/01082* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/30107* (2013.01)

(56) References Cited

U.S. PATENT DOCUMENTS

| | | | |
|---|---|---|---|
| 6,313,521 | B1 | 11/2001 | Baba |
| 6,853,069 | B2 | 2/2005 | Akram et al. |
| 6,909,194 | B2 | 6/2005 | Farnworth et al. |
| 7,061,123 | B1 | 6/2006 | Chee et al. |
| 7,217,646 | B2 | 5/2007 | Hedler et al. |
| 7,687,895 | B2 * | 3/2010 | Brunnbauer .......... H01L 21/561 257/685 |
| 7,906,860 | B2 * | 3/2011 | Meyer .................. H01L 21/561 257/723 |
| 2002/0086500 | A1 * | 7/2002 | Wu ..................... H01L 23/3128 438/455 |
| 2002/0110956 | A1 | 8/2002 | Kumamoto et al. |
| 2002/0140085 | A1 | 10/2002 | Lee et al. |
| 2004/0089955 | A1 | 5/2004 | Zhou |
| 2007/0096249 | A1 | 5/2007 | Roeper et al. |
| 2007/0109757 | A1 | 5/2007 | Lee et al. |
| 2008/0042265 | A1 | 2/2008 | Merilo et al. |
| 2008/0135977 | A1 * | 6/2008 | Meyer .................. H01L 24/82 257/531 |
| 2008/0265383 | A1 * | 10/2008 | Brunnbauer .......... H01L 21/561 257/659 |
| 2009/0008765 | A1 * | 1/2009 | Yamano ................ H01L 24/83 257/690 |

* cited by examiner

SEMICONDUCTOR DEVICE INCLUDING AT LEAST ONE ELEMENT

CROSS-REFERENCE TO RELATED APPLICATIONS

This Utility Patent Application is a continuation application of U.S. Ser. No. 14/189,304 filed Feb. 25, 2014 which is a continuation application of U.S. Ser. No. 12/048,602 filed Mar. 14, 2008, both of which are herein incorporated by reference.

BACKGROUND

Embedded wafer level ball grid array (eWLB) technology expands on typical wafer level packaging technologies by providing the ability for adding additional surface area for interconnecting silicon components in a semiconductor device. Therefore, eWLB technology provides the possibility of fabricating a semiconductor device by combining both active and passive silicon components into a single module. Passive components, however, are typically very small or include geometries (e.g., small surface area with large height) unfavorable to the molding process used to package the semiconductor device. The small components may not adhere to the carrier foil during the molding process due to the forces applied to the small components by the molding process. This may lead the small components to slip and break contact with the carrier foil.

For these and other reasons, there is a need for the present invention.

SUMMARY

One embodiment provides a semiconductor device. The semiconductor device includes a chip, at least one element electrically coupled to the chip, an adhesive at least partially covering the at least one element, and a mold material at least partially covering the chip and the adhesive.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
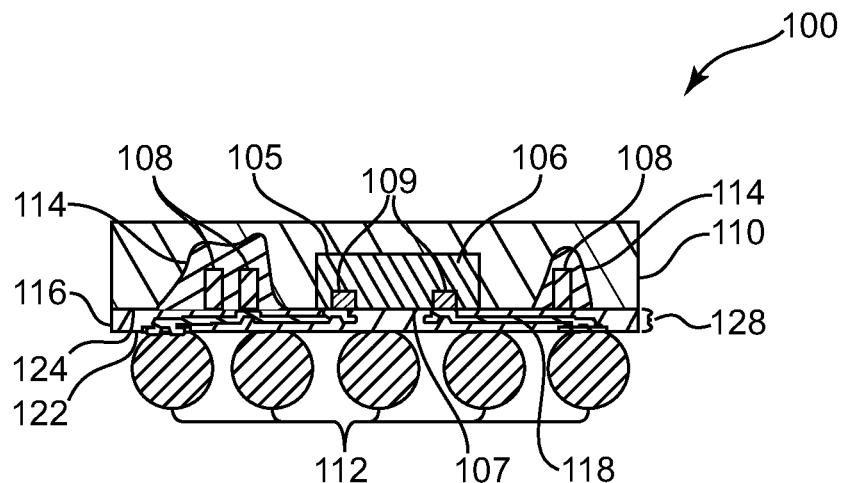
FIG. 1 illustrates a cross-sectional view of one embodiment of a semiconductor device.

FIG. 1 illustrates a cross-sectional view of one embodiment of a semiconductor device 100. Semiconductor device 100 is fabricated using a wafer level packaging process. Semiconductor device 100 includes a semiconductor chip 106, at least one element 108, an adhesive material 114, a molding material 110, a redistribution layer 128, and solder balls 112. Adhesive material 114 covers at least a portion of each element 108. Molding material 110 encapsulates at least one side of each semiconductor chip 106 and at least one side of each element 108 and adhesive material 114. Adhesive material 114 provides stability to elements 108 during the molding process so that elements 108 are not shifted, misplaced, or tilted after the molding process. In one embodiment, adhesive material 114 includes Durimide, a polyimide, an elastomer, a thermoplastic, an epoxy, or another suitable adhesive.

Semiconductor chip 106 has a first face 105 and an opposing second face 107. Semiconductor chip 106 includes contacts 109 with an exposed surface on the same plane as opposing second face 107. Redistribution layer 128 also has a first face 124 and an opposing second face 122. First face 124 of redistribution layer 128 is attached along second face 107 of chip 106.

In one embodiment, each element 108 is a passive component. In one embodiment, each element 108 includes a resistor, a capacitor, an inductor, a conductor, a solder element, a conductive sphere, or another suitable passive component. In one embodiment, the volume of each element 108 is less than the volume of semiconductor chip 106 by at least a factor of two. In another embodiment, the height of each element 108 is greater than the height of chip 106 in the direction perpendicular to redistribution layer 128.

Redistribution layer 128 includes insulating material 116 and conductive traces 118, which electrically couple semiconductor chip 106 to at least one element 108. Further, conductive spheres or solder balls 112 can be electrically coupled to conductive traces 118 at second face 124 of redistribution layer 128. Conductive traces 118 include Cu or other suitable conductive material or conductive material stack. Insulating material 116 includes a polyimide, an epoxy, or another suitable dielectric material.

Figure 2:
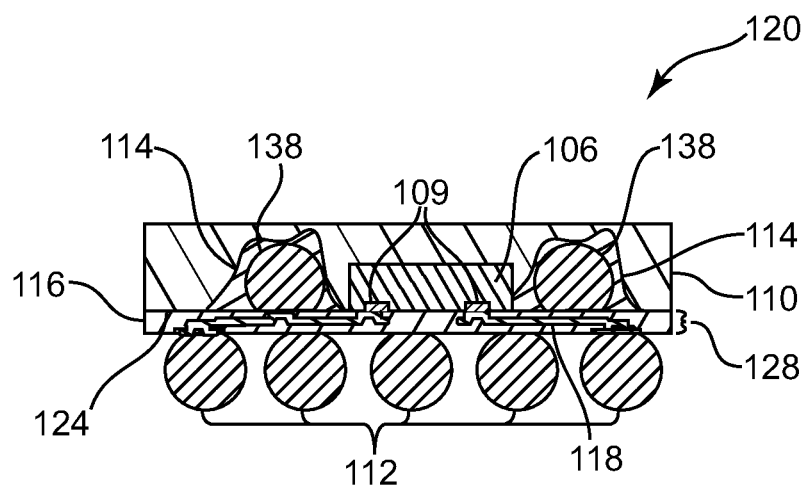
FIG. 2 illustrates a cross-sectional view of another embodiment of a semiconductor device.

FIG. 2 illustrates a cross-sectional view of another embodiment of a semiconductor device 120. Semiconductor device 120 is similar to semiconductor device 100 previously described and illustrated with reference to FIG. 1, except that elements 108 are replaced with conductive spheres or solder elements or balls 138 in semiconductor device 120. In this embodiment, adhesive material 114 provides stability to solder elements 138 during the molding process so that solder elements 138 are not shifted or misplaced after the molding process. Solder elements 138 can be used for 3D-contacts from the front-side to the back-side of the package.

The following FIGS. 3 through 9B illustrate embodiments of a process for fabricating a semiconductor device. FIGS. 5A, 6A, 7A, 8A, and 9A illustrate one embodiment for fabricating a semiconductor device, such as semiconductor device 100 previously described and illustrated with reference to FIG. 1. FIGS. 5B, 6B, 7B, 8B, and 9B illustrate another embodiment for fabricating a semiconductor device, such as semiconductor device 120 previously described and illustrated with reference to FIG. 2.

Figure 3:
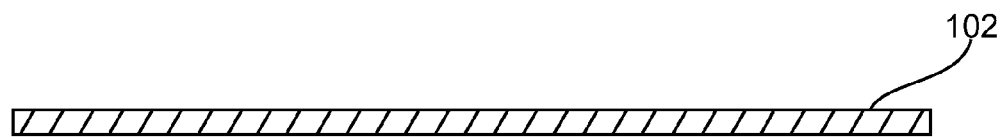
FIG. 3 illustrates a cross-sectional view of one embodiment of a carrier.

FIG. 3 illustrates a cross-sectional view of one embodiment of a carrier 102. Carrier 102 includes a metal, a polymer, silicon, or another suitable material.

Figure 4:
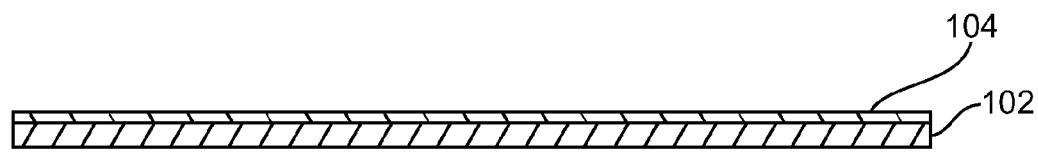
FIG. 4 illustrates a cross-sectional view of one embodiment of the carrier and a double-sided adhesive foil.

FIG. 4 illustrates a cross-sectional view of one embodiment of carrier 102 and a double-sided adhesive foil 104. A double-sided, releasable, adhesive foil 104 is laminated to carrier 102 or applied to carrier 102 using another suitable technique. In other embodiments, other suitable adhesives are used in place of adhesive foil 104.

Figure 5A:
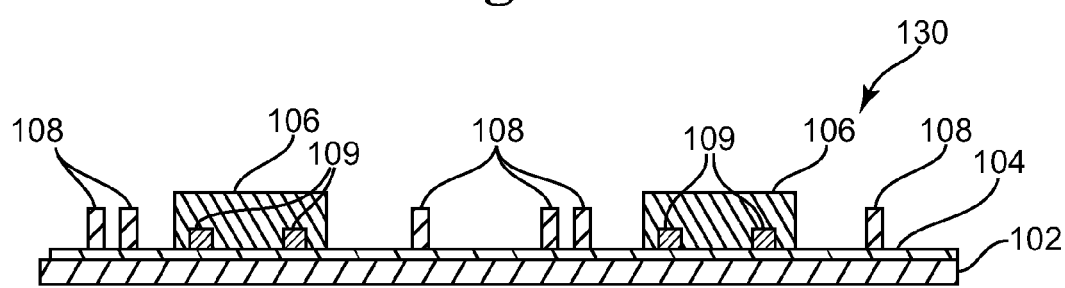
FIG. 5A illustrates a cross-sectional view of one embodiment of the carrier, the double-sided adhesive foil, elements, and semiconductor chips.

FIG. 5A illustrates a cross-sectional view of one embodiment of carrier 102, double-sided adhesive foil 104, elements 108, and semiconductor chips 106. Each element 108 and each semiconductor chip 106 is placed on adhesive foil 104. In one embodiment, at least two semiconductor chips 106 and at least two elements 108 are placed on adhesive foil 104. In one embodiment, the area of the surface of each element 108 at the interface to adhesive foil 104 is less than the area of the surface of semiconductor chip 106 at the interface to adhesive foil 104.

Figure 5B:
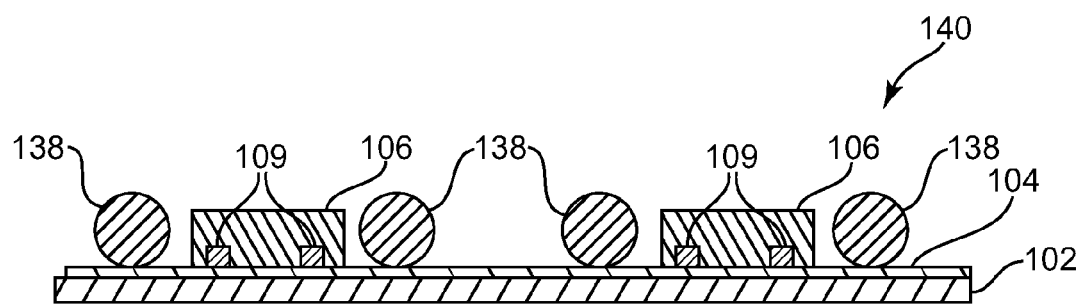
FIG. 5B illustrates a cross-sectional view of one embodiment of the carrier, the double-sided adhesive foil, solder elements, and semiconductor chips.

FIG. 5B illustrates a cross-sectional view of one embodiment of carrier 102, double-sided adhesive foil 104, solder elements 138, and semiconductor chips 106. Each semiconductor chip 106 and each solder element 138 is placed on adhesive foil 104. In one embodiment, at least two semiconductor chips 106 and at least two solder elements 138 are placed on adhesive foil 104. Due to the non-planar or spherical form of solder elements 138, solder elements 138 have less surface area than semiconductor chips 106 for attachment to adhesive foil 104.

Figure 6A:
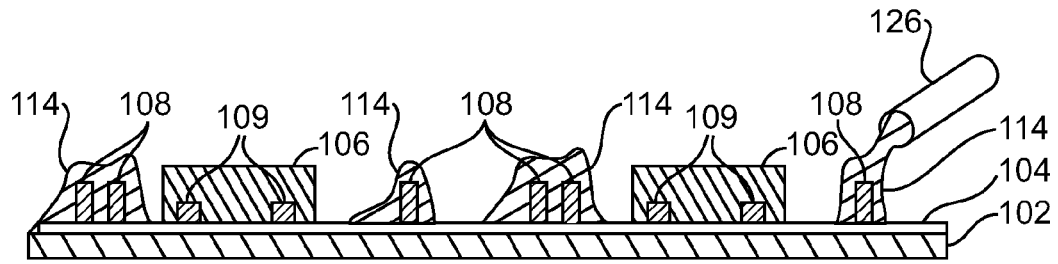
FIG. 6A illustrates a cross-sectional view of one embodiment of the carrier, the double-sided adhesive foil, the elements, the semiconductor chips, and an adhesive material.

FIG. 6A illustrates a cross-sectional view of one embodiment of carrier 102, double-sided adhesive foil 104, elements 108, semiconductor chips 106, and adhesive material 114. In one embodiment, a dispensing needle 126 dispenses an adhesive material 114 to adhere each element 108 to adhesive foil 104. Adhesive material 114 includes an epoxy, a thermoplastic, a silicone, a polyimide, an elastomer, or another suitable material. Adhesive material 114 at least partially covers each element 108 and provides improved attachment of elements 108 to adhesive foil 104 prior to molding. In another embodiment, a printing process, a jetting process, or another suitable process is used to apply adhesive material 114 over or at each element 108.

Adhesive material 114 can then be cured by using any suitable form of energy (e.g., thermal, chemical) if a curing step is needed for the adhesive material. In one embodiment, semiconductor chip 106 is placed in close proximity to elements 108; thereby adhesive material 114 is also applied to at least one surface of semiconductor chip 106. In another embodiment, adhesive material 114 is applied to at least a portion of adhesive foil 104 before elements 108 are placed on adhesive foil 104. Elements 108 are then placed into adhesive material 114.

Figure 6B:
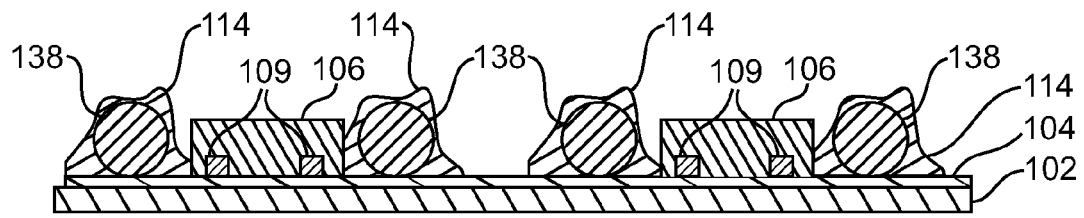
FIG. 6B illustrates a cross-sectional view of one embodiment of the carrier, the double-sided adhesive foil, the solder elements, the semiconductor chips, and an adhesive material.

FIG. 6B illustrates a cross-sectional view of one embodiment of carrier 102, double-sided adhesive foil 104, solder elements 138, semiconductor chips 106, and adhesive material 114. In one embodiment, a dispensing needle dispenses an adhesive material 114 to adhere each solder element 138 to adhesive foil 104. Adhesive material 114 includes an epoxy or another suitable material. Adhesive material 114 at least partially covers each solder element 138 and provides improved attachment of solder elements 138 to adhesive foil 104 prior to molding. In another embodiment, a printing process, a jetting process, or another suitable process is used to apply adhesive material 114 over or at each solder element 138.

Adhesive material 114 can then be cured by using any suitable form of energy (e.g., thermal, chemical) if a curing step is needed for the adhesive material. In one embodiment, semiconductor chip 106 is placed in close proximity to solder elements 138; thereby adhesive material 114 is also applied to at least one surface of semiconductor chip 106. In another embodiment, adhesive material 114 is applied to at least a portion of adhesive foil 104 before solder elements 138 are placed on adhesive foil 104. Solder elements 138 are then placed into adhesive material 114.

Figure 7A:
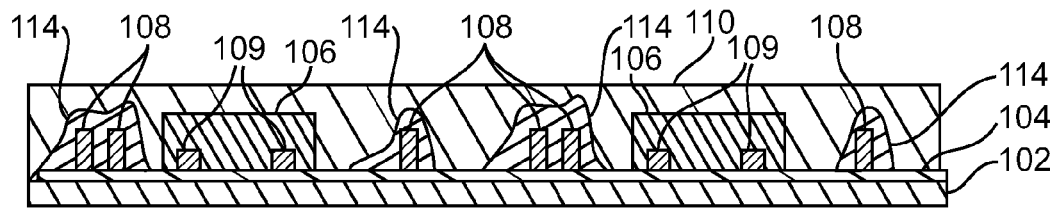
FIG. 7A illustrates a cross-sectional view of one embodiment of the carrier, the double-sided adhesive foil, the elements, the semiconductor chips, the adhesive material, and a molding material.

FIG. 7A illustrates a cross-sectional view of one embodiment of carrier 102, double-sided adhesive foil 104, elements 108, semiconductor chips 106, adhesive material 114, and molding material 110. Adhesive material 114, elements 108, and semiconductor chips 106 are at least partially encapsulated by molding material 110. In one embodiment, the entire encapsulation process is performed by mold encapsulation. Carrier 102 is placed in a molding tool. A liquid mold compound having a high viscosity is dispensed in the center of carrier 102 where semiconductor chips 106 and elements 108 have been placed. The top of the molding tool is closed, causing the liquid mold compound to flow from the center to the edges of the molding tool. Flow of the mold compound applies forces on semiconductor chips 106 and elements 108. Due to adhesive material 114, however, elements 108 do not shift or tilt in response to the forces.

Figure 7B:
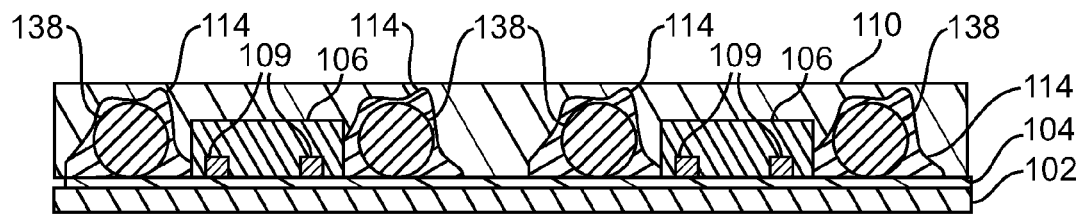
FIG. 7B illustrates a cross-sectional view of one embodiment of the carrier, the double-sided adhesive foil, the solder elements, the semiconductor chips, the adhesive material, and a molding material.

FIG. 7B illustrates a cross-sectional view of one embodiment of carrier 102, double-sided adhesive foil 104, solder elements 138, semiconductor chips 106, adhesive material 114, and molding material 110. Adhesive material 114, solder elements 138, and semiconductor chips 106 are at least partially encapsulated by molding material 110 using a similar process as described with reference to FIG. 7A. Due to adhesive material 114, solder elements 138 do not shift during the molding process.

Figure 8A:
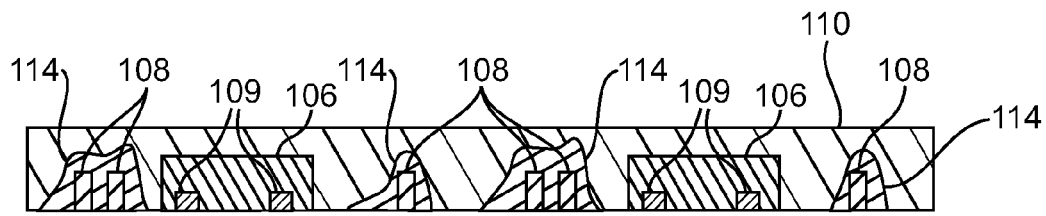
FIG. 8A illustrates a cross-sectional view of one embodiment of the elements, the semiconductor chips, the adhesive material, and the molding material after the release of the carrier and the double-sided adhesive foil.

FIG. 8A illustrates a cross-sectional view of one embodiment of elements 108, semiconductor chips 106, adhesive material 114, and molding material 110 after release of carrier 102 and double-sided adhesive foil 104. The release of adhesive foil 104 and carrier 102 is completed after application of molding material 110. One surface of each element 108 and each semiconductor chip 106 is exposed where adhesive foil 104 was previously attached.

Figure 8B:
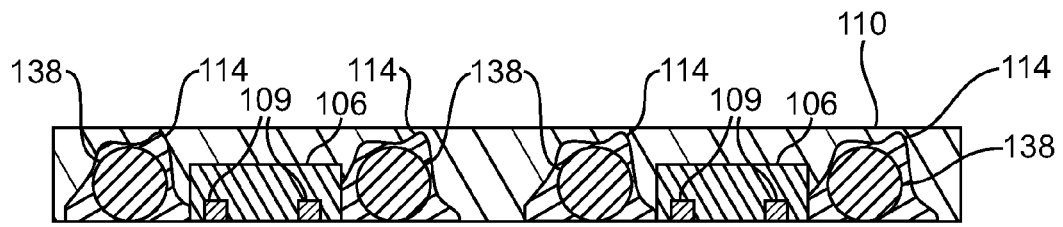
FIG. 8B illustrates a cross-sectional view of one embodiment of the solder elements, the semiconductor chips, the adhesive material, and the molding material after release of the carrier and the double-sided adhesive foil.

FIG. 8B illustrates a cross-sectional view of one embodiment of solder elements 138, semiconductor chips 106, adhesive material 114, and molding material 110 after release of carrier 102 and double-sided adhesive foil 104. A surface of each solder element 138 and each semiconductor chip 106 is exposed where adhesive foil 104 was previously attached.

Figure 9A:
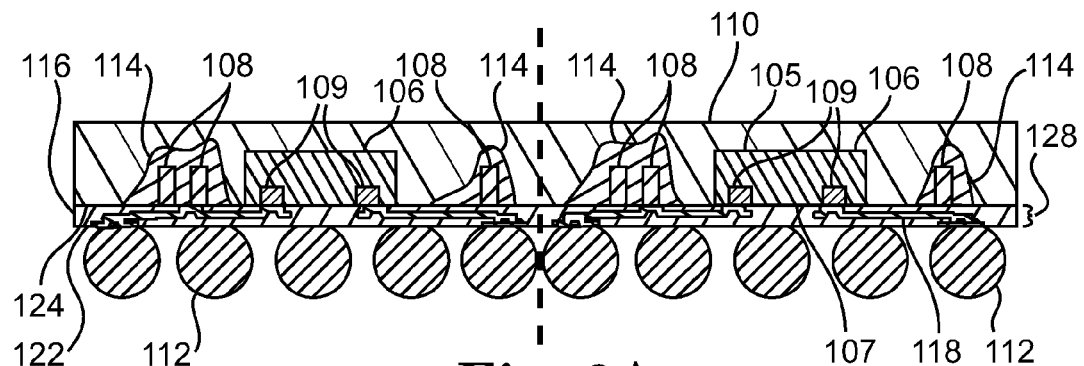
FIG. 9A illustrates a cross-sectional view one embodiment of multiple semiconductor devices prior to singulation.

FIG. 9A illustrates a cross-sectional view of one embodiment of multiple semiconductor devices prior to singulation. A redistribution layer 128 is fabricated. Redistribution layer 128 includes conductive traces 118 formed in a conductive layer. Conductive traces 118 on first face 124 of redistribution layer 128 are electrically coupled to and directly contact semiconductor chips 106 and/or elements 108. Redistribution layer 128 also includes insulating material 116 surrounding conductive traces 118. Conductive spheres or solder balls 112 are electrically coupled to conductive traces 118 on second face 122 of redistribution layer 128.

The semiconductor devices are then separated from one another. The dashed line in FIG. 9A indicates where molding material 110 and redistribution layer 128 are cut to separate the semiconductor devices. Each semiconductor device includes a semiconductor chip 106 and at least one element 108. The semiconductor devices are separated by sawing, etching, or other suitable method to provide semiconductor devices 100 as previously described and illustrated with reference to FIG. 1.

Figure 9B:
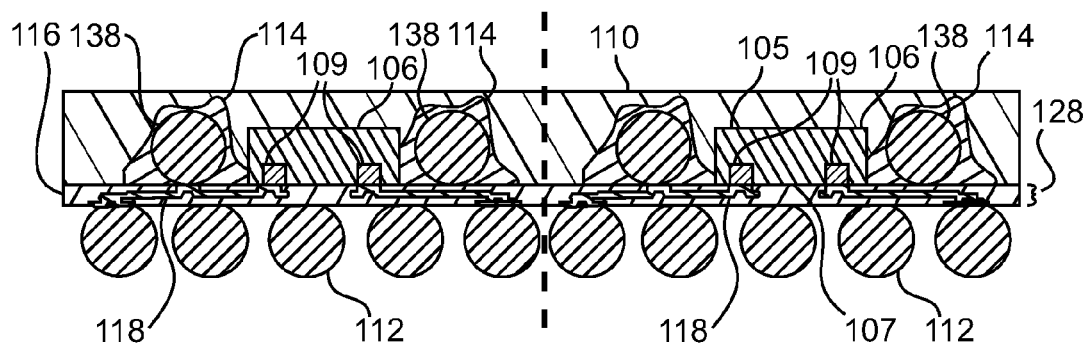
FIG. 9B illustrates a cross-sectional view of another embodiment of multiple semiconductor devices prior to singulation.

FIG. 9B illustrates a cross-sectional view of another embodiment of multiple semiconductor devices prior to singulation. A redistribution layer 128 and conductive spheres or solder balls 112 are fabricated using a similar process as previously described with reference to FIG. 9A. The dashed line in FIG. 9B indicates where molding material 110 and redistribution layer 128 are cut to separate the semiconductor devices. Each semiconductor device includes a semiconductor chip 106 and at least one solder element 138. The semiconductor devices are separated by sawing, etching, or other suitable method to provide semiconductor devices 120 as previously described and illustrated with reference to FIG. 2.

Embodiments provide semiconductor devices using eWLB technology. Elements and/or solder balls are placed on adhesive foil in addition to semiconductor chips. Adhesive material is deposited over or at the elements and/or solder balls to provide increased stability and decreased displacement of the elements and/or solder balls during the molding process. After the adhesive material adheres to the elements and/or solder balls and the adhesive foil, the semiconductor chips, elements and/or solder balls, and adhesive material are encapsulated in mold material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor device, the method comprising:
    placing at least two chips and at least two elements on a carrier, each element having a first surface placed on the carrier and a plurality of remaining exposed surfaces including an opposing second surface;
    applying an adhesive material over the at least two elements and over at least a portion of one surface of the at least two chips such that the adhesive material covers all remaining exposed surfaces of the plurality of remaining exposed surfaces of the at least two elements including the opposing second surface;
    applying an encapsulation material over at least a portion of the at least two chips; and
    separating the at least two chips and the at least two elements to provide semiconductor devices, each semiconductor device including at least one chip and at least one element.

2. The method of claim 1, further comprising:
    applying the encapsulation material over the adhesive material.

3. The method of claim 1, wherein applying the adhesive material comprises dispensing the adhesive material.

4. The method of claim 1, wherein applying the adhesive material comprises one of printing the adhesive material and jetting the adhesive material.

5. The method of claim 1, further comprising:
    separating the at least two chips and the at least two elements from the carrier after applying the encapsulation material.

6. The method of claim 1, further comprising:
    applying a conductive layer to the at least two chips and the encapsulation material before separating the least two chips and the at least two elements.

7. The method of claim 6, further comprising:
    applying solder elements to the conductive layer before separating the at least two chips and the at least two elements.

8. The method of claim 1, wherein placing the at least two elements comprises placing at least one of a resistor, a capacitor, an inductor, a conductor, a solder element, and a conductive sphere.

9. The method of claim 1, wherein separating the at least two chips from each other comprises one of sawing the encapsulation material and etching the encapsulation material.

10. A method of fabricating a semiconductor device, the method including:
    applying an adhesive layer to a first major surface of a carrier;
    placing a first major surface of a semiconductor chip on a first major surface of the adhesive layer, the semiconductor chip including exposed contacts coplanar with the first major surface of the semiconductor chip;

placing at least one passive element on the first major surface of the adhesive layer and laterally spaced from the semiconductor chip, the at least one passive element having a surface placed on the adhesive layer and a plurality of remaining exposed surfaces including an opposing second surface; and applying an adhesive material to cover all remaining surfaces of the at least one passive element including the opposing second surface, and at least one surface of the semiconductor chip to secure the at least one passive element to the adhesive layer.

11. The method of claim 10, including:
applying the adhesive material using one of a printing process, a jetting process, and a needle dispensing process.

12. The method of claim 10, including:
curing the adhesive layer.

13. The method of claim 10, including:
applying an encapsulation material over the semiconductor chip, the at least one element, and exposed portions of the first major surface of the adhesive layer.

14. The method of claim 13, including:
removing the adhesive layer and the carrier such that a surface of the encapsulation material formerly covering portions of the first major surface of the adhesive layer, the first major surface and exposed contacts of the semiconductor chip, and an exposed surface of the at least one element together form a coplanar surface.

15. The method of claim 14, including:
forming a redistribution layer on the coplanar surface, the redistribution layer including a first planar face disposed on the coplanar surface and an opposing second planar face, and including conductive traces, including a conductive trace directly in contact with the exposed surface of the at least one element and an exposed contact of the semiconductor chip.

16. The method of claim 15, including:
disposing a plurality of solder ball contacts on the second planar face of the redistribution layer, the solder ball contacts in electrical communication with the exposed contacts of the semiconductor chips and the at least one element via the conductive traces.

17. The method of claim 10, wherein the at least one passive element comprises one of a resistor, capacitor, and an inductor.

18. The method of claim 10, wherein the at least one passive element comprises one of conductor, a solder element, and conductive sphere.

19. Then method of claim 10, wherein applying the adhesive material comprises applying the adhesive material such that the adhesive material extends between the at least one passive element and the at least one surface of the semiconductor chip.

20. A method for fabricating a semiconductor device, the method comprising:
placing at least two chips and at least two elements on a carrier, wherein each element includes one of a conductive sphere, a solder element, and a ball;
applying an adhesive material over all surfaces of the at least two elements;
applying an encapsulation material over at least a portion of the at least two chips; and
separating the at least two chips and the at least two elements to provide semiconductor devices, each semiconductor device including at least one chip and at least one element.

21. The method of claim 20, further comprising:
applying the encapsulation material over the adhesive material.

22. The method of claim 20, wherein applying the adhesive material comprises dispensing the adhesive material.

23. The method of claim 20, wherein applying the adhesive material comprises one of printing the adhesive material and jetting the adhesive material.

24. The method of claim 20, further comprising:
separating the at least two chips and the at least two elements from the carrier after applying the encapsulation material.

25. The method of claim 20, further comprising:
applying a conductive layer to the at least two chips and the encapsulation material before separating the least two chips and the at least two elements.

26. The method of claim 25, further comprising:
applying solder elements to the conductive layer before separating the at least two chips and the at least two elements.

27. The method of claim 20, wherein separating the at least two chips from each other comprises one of sawing the encapsulation material and etching the encapsulation material.

28. The method of claim 20, wherein applying the adhesive material comprises applying the adhesive material over at least one surface of the at least two chips.

* * * * *